(12) United States Patent
Al-Khalidi et al.

(10) Patent No.: US 11,799,422 B2
(45) Date of Patent: Oct. 24, 2023

(54) OSCILLATOR WITH REDUCED TEMPERATURE SENSITIVITY

(71) Applicant: TEXAS INSTRUMENTS INCORPORATED, Dallas, TX (US)

(72) Inventors: Muawiya Ali Al-Khalidi, Glendale, AZ (US); Angelo William Pereira, Allen, TX (US); Pinar Korkmaz, Allen, TX (US); Paul David Curtis, Phoenix, AZ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/681,945

(22) Filed: Feb. 28, 2022

(65) Prior Publication Data

US 2023/0275545 A1    Aug. 31, 2023

(51) Int. Cl.
*H03B 5/04* (2006.01)
*H03K 3/03* (2006.01)
*H03K 5/24* (2006.01)

(52) U.S. Cl.
CPC ............. *H03B 5/04* (2013.01); *H03K 3/0315* (2013.01); *H03K 5/24* (2013.01)

(58) Field of Classification Search
CPC ........................................................ H03B 5/04
USPC ............................................................ 331/66
See application file for complete search history.

(56) References Cited

U.S. PATENT DOCUMENTS

| 7,385,453 B2 * | 6/2008 | Nervegna | H03K 3/011 |
| | | | 331/177 V |
| 8,044,740 B2 * | 10/2011 | Zhu | H03L 1/022 |
| | | | 331/111 |
| 2014/0062596 A1 * | 3/2014 | Glibbery | H03F 3/45179 |
| | | | 331/111 |
| 2018/0342980 A1 * | 11/2018 | Esterline | H03L 7/099 |

* cited by examiner

*Primary Examiner* — Joseph Chang
(74) *Attorney, Agent, or Firm* — Ray A. King; Frank D. Cimino (57) ABSTRACT

An oscillator circuit includes a comparator having first and second inputs, the first input configured to be coupled to a reference voltage. The oscillator circuit also includes a capacitor and a first current source. The capacitor is coupled between the second input and ground. The first current source is coupled between a supply voltage terminal and the capacitor. The first current source is configured to generate a current to the capacitor that is proportional to absolute temperature.

19 Claims, 5 Drawing Sheets

|  |  | C60 | C95 | C125 | C150 |
|---|---|---|---|---|---|
|  | 25 | 60 | 95 | 125 | 150 |
|  |  | ADD/SUB FROM 25c | ADD/SUB FROM 25c | ADD/SUB FROM 25c | ADD/SUB FROM 25c |
| 0 | C1 | 0 | 0 | 0 | 0 |
| 1 | C1 | 0 | 1 | 1 | 2 |
| 2 | C1 | 0 | 1 | 2 | 3 |
| 3 | C1 | 1 | 2 | 3 | 4 |
| 4 | C1 | 1 | 2 | 4 | 5 |
| 5 | C1 | 1 | 3 | 5 | 7 |
| 6 | C1 | 2 | 4 | 6 | 8 |
| 7 | C1 | 2 | 5 | 7 | 9 |

OSCILLATOR WITH REDUCED TEMPERATURE SENSITIVITY

BACKGROUND

An oscillator circuit generates a dock signal (also referred to as a "dock") that has a periodic waveform in which a voltage toggles between a higher voltage level and a lower voltage level. A clock may be a square wave or may have a duty cycle other than 50%. Numerous types of circuits operate using docks. Examples of circuits that use a dock for their operation include microcontrollers, switching regulators, analog-to-digital converters, etc. The oscillator circuit produces the clock at a frequency suitable to operate the circuit that uses the clock.

SUMMARY

In one example, an integrated circuit (IC) includes a temperature sensing circuit having one or more temperature sensing circuit outputs. The temperature sensing circuit is configured to generate temperature signals on the one or more temperature sensing circuit outputs. The temperature signals are indicative of a temperature of the IC. The IC also includes non-volatile storage, an oscillator circuit, and a digital control circuit. The non-volatile storage is configured to store a trim code and an offset value. The trim code corresponds to a first temperature, and the offset value corresponds to a second temperature. The oscillator circuit has a control input and an oscillator output. The digital control circuit has a temperature sensing circuit input, a clock input, and an adaptive trim code output. The temperature sensing circuit input is coupled to the temperature sensing circuit outputs. The clock input is coupled to the oscillator output. The adaptive trim code output is coupled to the control input. The digital control circuit is configured to cause the trim code from the non-volatile memory to be provided to the control input. The digital control circuit is configured to modify the trim code based on the temperature signals from the temperature sensing circuit and based on the offset value to produce an adjusted trim code, and to provide the adjusted trim code to the control input.

In another example, an oscillator circuit includes a comparator having first and second inputs, the first input configured to be coupled to a reference voltage. The oscillator circuit also includes a capacitor and a first current source. The capacitor is coupled between the second input and ground. The first current source is coupled between a supply voltage terminal and the capacitor. The first current source is configured to generate a current to the capacitor that is proportional to absolute temperature.

DETAILED DESCRIPTION

Many electrical components and circuits have temperature dependencies. An oscillator circuit may produce an output clock whose frequency varies with temperature. Many applications, however, would benefit from an oscillator circuit that produces a clock with little or no temperature variation. In automobile applications, for example, the Automotive Electronics Council (AEC) has established four temperature ranges against which devices such as integrated circuits are qualified. The widest temperature is Grade 0 which has a temperature range from −40° C. to 150° C. An IC that passes the AEC-Q100 stress test for Grade 0 is qualified to function correctly for that temperature range. The oscillator circuit in such an IC should produce a clock with a frequency that is highly accurate (e.g., ±3%) across the temperature range of −40° C. to 150° C.

The embodiments described herein are directed to an oscillator circuit that produces a clock whose frequency is much less dependent on temperature than other oscillator circuits. In one embodiment, the oscillator circuit's frequency is adjustable, and a digital control circuit receives signals from a temperature sensing circuit indicative of temperature and dynamically provides an updated trim code to the oscillator circuit to cause the oscillator circuit to vary its clock's frequency. In another embodiment, the oscillator circuit is a ramp-based oscillator in which two current sources charge a capacitor. One current source is approximately constant with respect to temperature (although it may have some temperature dependence), and another current source is a proportional to absolute temperate (PTAT) current source. The use of the PTAT current source reduces the temperature dependence on the oscillator circuit's output frequency. The capacitor may be a complementary to absolute temperature (CTAT) capacitor to assist in further reducing the oscillator's output frequency dependence on temperature.

Figure 1:
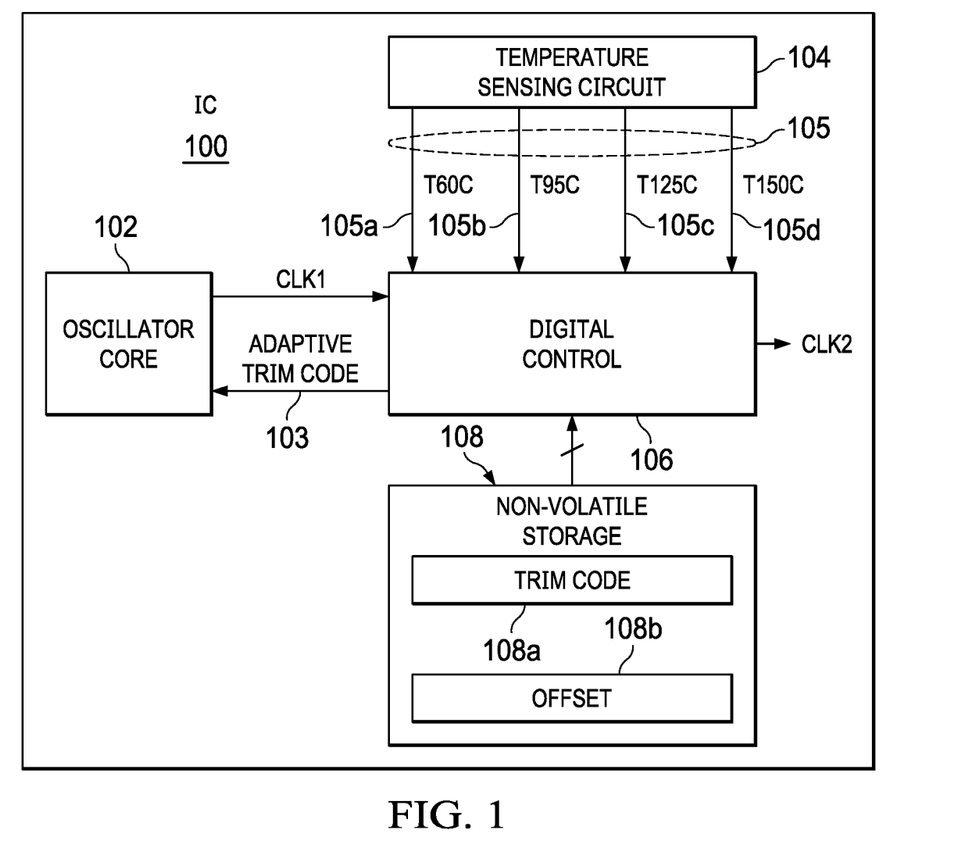
FIG. 1 is a block diagram of an integrated circuit (IC) including an oscillator core whose frequency is adjustable based on temperature signals from a temperature sensing circuit in accordance with an example.
Figure 3:
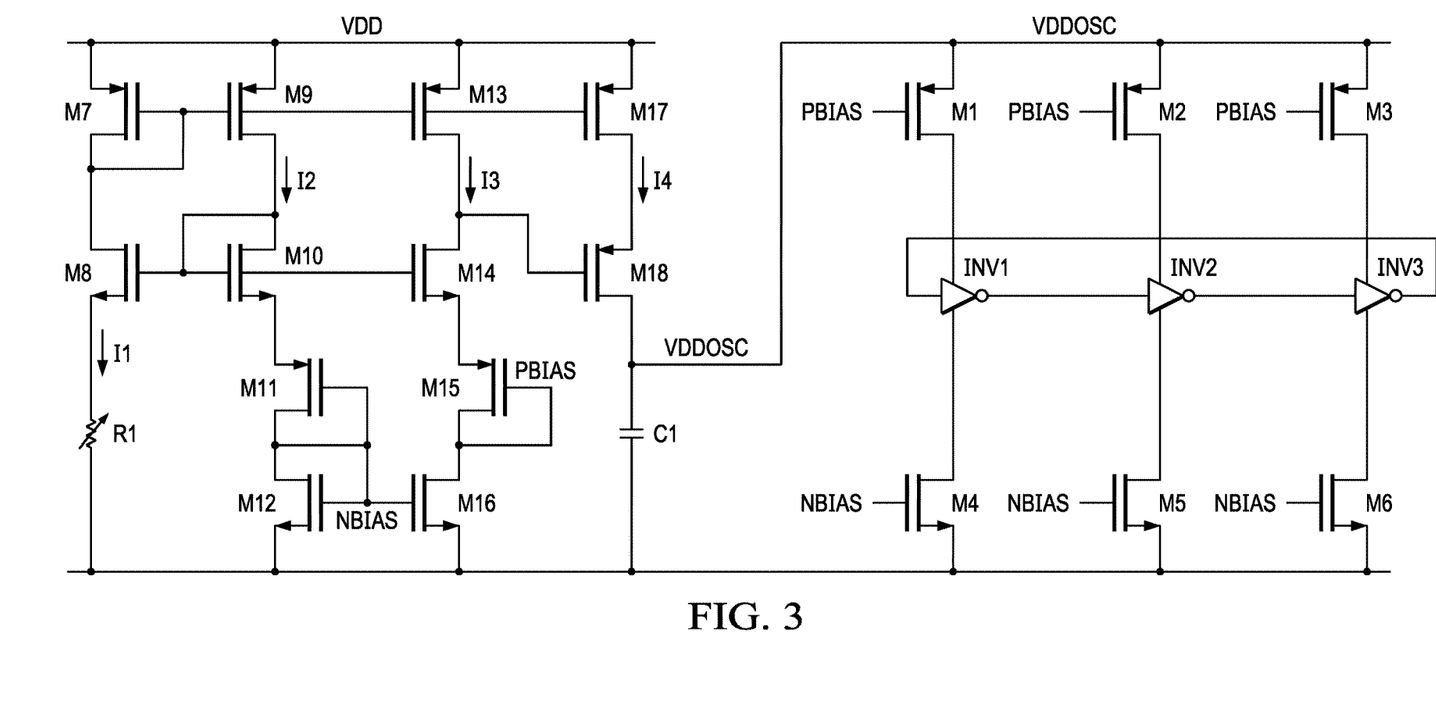
FIG. 3 is a ring oscillator usable as the oscillator core of FIG. 1 in accordance with an example.
Figure 4:
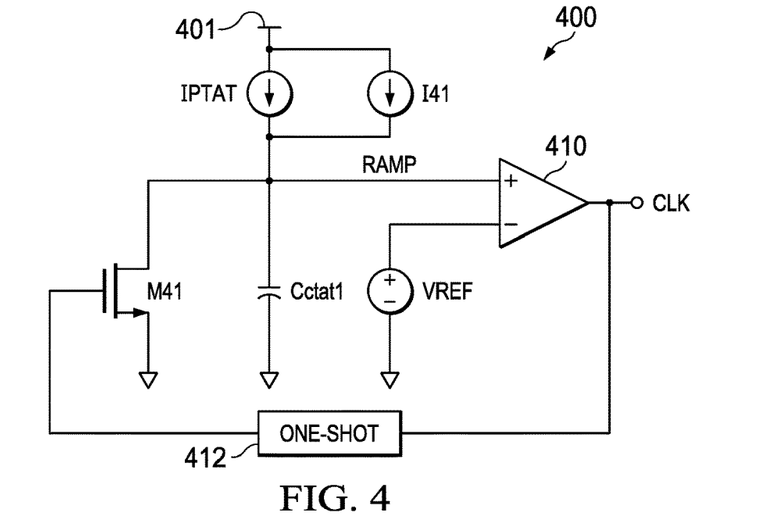
FIG. 4 is a schematic of a ramp circuit usable as an oscillator core in which the ramp circuit includes a current source producing a current that is proportional to absolute temperature to render the ramp circuit's output frequency less variable based on temperature, in accordance with an example.
Figure 7:
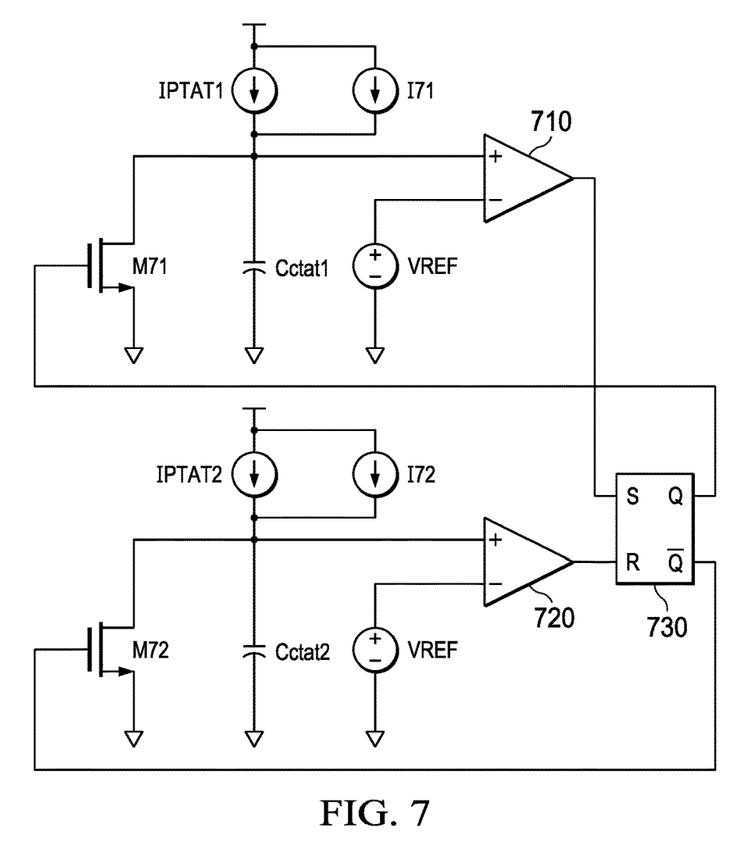
FIG. 7 is a schematic of a dual ramp circuit usable as an oscillator core and including proportional to absolute temperature current sources in both ramp portions of the dual ramp circuit, in accordance with an example.

FIG. 1 is a block diagram of an IC 100 which includes an oscillator core 102, a temperature sensing circuit 104, a digital control circuit 106, and non-volatile storage 108. The oscillator core 102 is a circuit that generates a clock (CLK1) at a target frequency (e.g., 500 KHz to 5 MHz). The oscillator core 102 can be implemented as any suitable type of oscillator circuit. Examples of suitable oscillator core circuits include ring oscillators (FIG. 3) and ramp-based oscillators (FIGS. 4 and 7).

The frequency of CLK1 produced by the oscillator core 102 in this example is adjustable. The oscillator core 102 has a control input 103 through which the oscillator core 102 can receive a trim code from, for example, the digital control circuit 106. FIG. 3 (described below) is an example implementation of an oscillator core whose output frequency is adjustable. The trim code received from the digital control circuit 106 is labeled as an "adaptive" trim code. The trim code provided by the digital control circuit 106 to the oscillator core 102 is adaptive based on the temperature sensed by the temperature sensing circuit 104. By adjusting the frequency of CLK1 based on temperature, the oscillator core 102 produces a clock whose frequency is less variable based on temperature than oscillators without temperature compensation.

The temperature sensing circuit 104 includes a temperature sensor and analog and digital circuitry to generate output temperature flag signals 105 which are indicative of the temperature of the IC 100. The temperature sensor itself may be a PN diode or a BJT configured as a diode such that the base-emitter junction is forward biased. The diode or BJT may be biased with a fixed current, and the diode anode-to-cathode potential or the BJT's base-to-emitter potential will exhibit a CTAT temperature behavior which can be monitored using comparators.

The non-volatile storage 108 (e.g., a read-only memory device) is configured to store a trim code 108a and an offset value 108b. The trim code 108a and the offset value 108b are generated and stored in the IC's non-volatile storage 108 before the IC 100 is installed in a system. For example, the trim code 108a and the offset value 108b are generated during production of the IC, and are generated based on two different temperatures. The trim code 108a is a trim value determined for the oscillator core 102 at a particular temperature to cause the oscillator's output frequency to be a target frequency when the IC is that particular temperature. In one example, the temperature for which the trim code 108a is determined is 25° C. The offset value 108b is used to adjust the trim code 108b for a different temperature. In one example, the temperature corresponding to the offset value 108b is 125° C. For example, if the IC's temperature was 125° C., then the offset value 108b would be added to (or subtracted from, depending on the implementation of the adjustability of the oscillator core 102) the trim code 108a to produce a new (adaptive) trim code for the oscillator core 102 so as to cause the oscillator core to generate CLK1 at the target frequency for that particular temperature.

The digital control circuit 106 receives the temperature flag signals 105 from the temperature sensing circuit 104 as well as CLK1 from the oscillator core 102. The digital control circuit 106 uses CLK1 to control the operation of the digital control circuit 106. In one embodiment, the digital control circuit 106 includes a combination of logic gates, flip-flops, etc. that implements the functionality described herein as attributed to the digital control circuit 106. In another embodiment, the digital control circuit 106 is a microcontroller (or other type of processor) that executes machine instructions to implement the functionality described herein.

The digital control circuit 106 also generates an output clock, CLK2, based on CLK1. In one example, CLK2 is CLK1 (forwarded by the digital control circuit to an output clock terminal of the digital control circuit). In another example, the digital control circuit 106 includes a frequency divider to divide down the frequency of CLK1 to produce CLK2. CLK2 from the digital control circuit 106 is provided to downstream circuits (not shown) for controlling their operation. Examples of downstream circuits using CLK2 (which is derived from CLK1) include switching voltage regulators, analog-to-digital converters, etc.

At power-on or a reset event of the IC 100, the digital control circuit 106 reads the trim code 108a and the offset value 108b from the non-volatile storage 108. The digital control circuit 106 provides the trim code 108a to the oscillator core 102. The oscillator core 102 applies the trim code 108a, which implements an adjustment to the frequency of CLK1.

Thereafter, during runtime of the IC 100, if the temperature of the IC increases, a temperature flag signal 105 will be asserted corresponding to certain temperature thresholds. In the example of FIG. 1, the temperature sensing circuit 104 provides four output temperature flag signals 105a, 105b, 105c, and 105d. Each temperature flag corresponds to a different temperature threshold. In one example, temperature flag signal 105a corresponds to a temperature of 60° C. Temperature flag signal 105b corresponds to a temperature of 95° C. Temperature flag signal 105c corresponds to a temperature of 125° C. Temperature flag signal 105d corresponds to a temperature of 150° C. The number of temperature flag signals and their corresponding temperature thresholds can be different than what is shown in the example of FIG. 1. For example, the number of flag signals can be more or less than four, and the temperature thresholds may be different than 60° C., 95° C., 125° C., and 150° C. When the IC's temperature exceeds one of the temperature thresholds, the temperature flag signal corresponding to that particular temperature threshold is asserted (e.g., logic high). For example, if the IC's temperature reaches 60° C., then temperature flag signal 105a is asserted, while the remaining flag signals 105b-105d are not asserted. If the temperature further increases to 100° C., then flag signal 105b is also asserted (with flag signal 105a remaining in its asserted logic state). Similarly, if the temperature reaches 125° C., then temperature flag signals 105a, 105b, and 105c are all asserted but not flag signal 150° C. If the temperature reaches 150° C., then all four flag signals 105a-105d will be asserted by the temperature sensing circuit 104.

Figure 2:
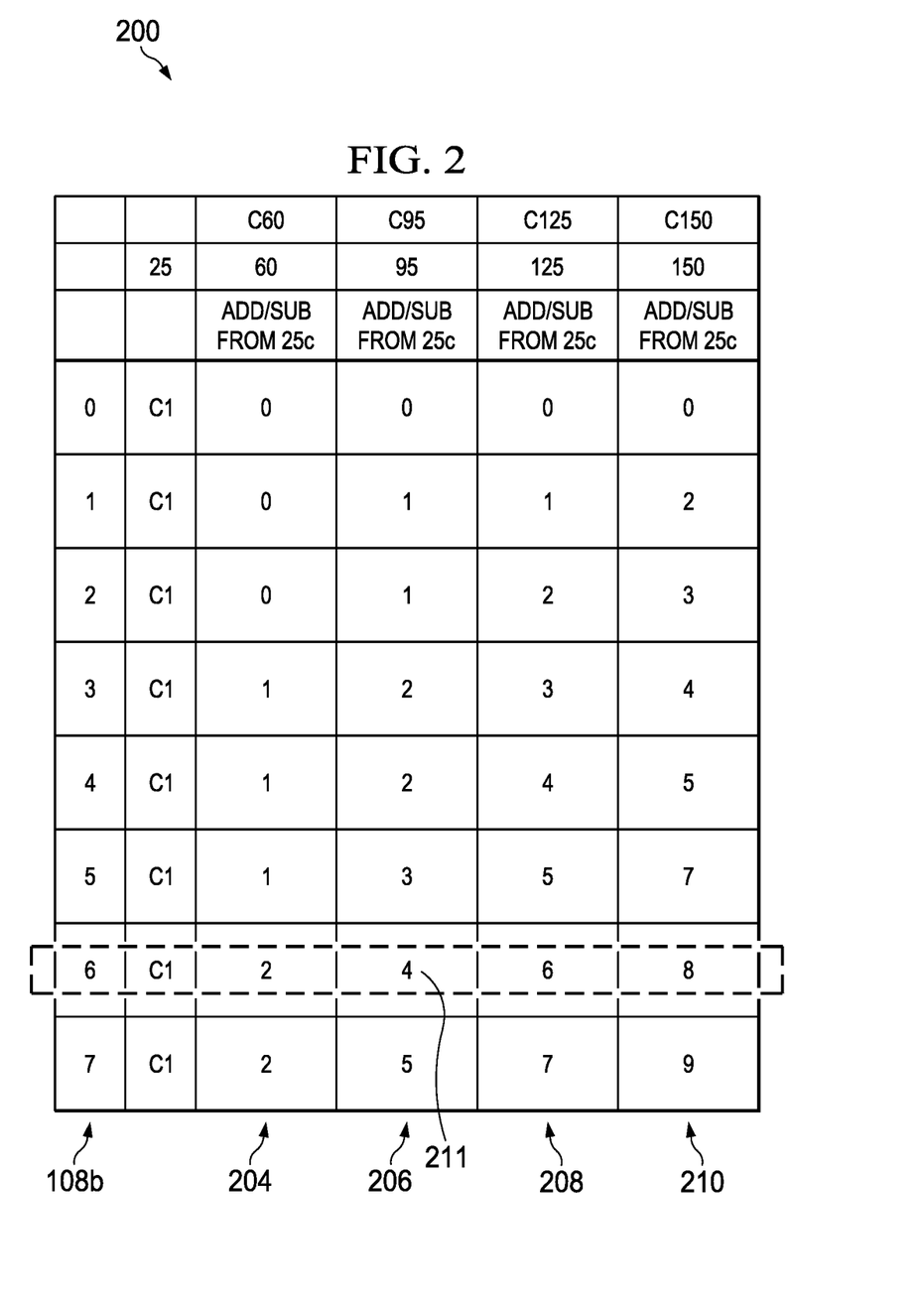
FIG. 2 is an example look-up table (LUT) usable by a digital control circuit to determine adaptive trim codes for the oscillator core.

The digital control circuit 106 may implement a look-up table (LUT) from which the adaptive trim code is determined. An example of a suitable LUT 200 is shown in FIG. 2. In the example of FIG. 2, the offset value 108b is a 3-bit value (but in general can be any number of bits). As a 3-bit value, the offset value 108b ranges from 0 to 7 (decimal). The seven different values of the offset value 108b represent indices into the LUT 200. Accordingly, each value of the offset value 108b indexes a specific row in the LUT 200. Column 204 in LUT 200 includes offset values for 60° C. depending on the offset value 108b. Similarly, columns 206, 208, and 210 include offset values for 95° C., 125° C., and 150° C., respectively, depending on the offset value 108b.

By way of example, the LUT row corresponding to an offset value 108b equal to 6 has been highlighted (encircled with a dashed oval). The offset values in that row are 2, 4, 6, and 8, and these offset values are to be added to the trim code 108a (from the non-volatile storage 108) depending on which temperature flag signal 105 has been asserted. To the extent multiple temperature flag signals 105 are asserted, the digital control circuit 106 uses the temperature flag signal corresponding to the highest temperature value. For example, if the IC's temperature is between 95° C. and 125° C., then temperature flag signals 105a and 105b will be asserted by the temperature sensing circuit 104. In that case, temperature flag signal 105b is used. For an offset value of 6 and an asserted temperature flag signal 105b, the LUT 200 indicates that the trim code is to be adjusted based on an offset value of 4 (as indicated by reference numeral 211). In one example, the digital control circuit 106 adds the offset value of 4 to the trim code 108b to thereby generate an adaptive trim code to be provided to the oscillator core 102.

The oscillator core 102 then applies the new trim code to adjust its output clock frequency accordingly.

For some types of oscillator cores, as temperature increases, the oscillator's output frequency decreases, but for other types of oscillators, frequency increases as temperature increases. Further, some oscillators must receive a larger trim code to increase their frequency, while other oscillators must receive a smaller trim code to increase their frequency. The examples described herein pertain to an oscillator whose frequency inherently decreases with increasing temperature and thus the trim codes should be modified to increase the frequency with increasing temperature.

In one example, the trim code provided by the digital control circuit 106 to the oscillator core 102 is a 7-bit value. As a 7-bit value, the trim code ranges from 0 to 128 (decimal). The trim code 108*a* stored in the non-volatile storage 108 for a temperature at 25° C. may be at approximately the mid-range of the 7-bit value, for example, at approximately 64. Accordingly, with the trim code for 25° C. being at the mid-range of the span of possible trim codes (0 to 128), the largest possible range to both increase or decrease the trim code based on temperature is possible. In the example of the offset value being a 3-bit value, the range of offset values is 0 to 7. Accordingly, the trim code 108*a* can range from 64 to 71 based on the possible range of offset values in the case in which the trim code should be increased, or can range from 57 to 64 if the offset values are used to decrease the trim code.

The LUT table 200 of FIG. 2 also includes offset values corresponding to 150° C. (a temperature higher than the 125° C. used to determine offset value 108*b*). Column 210 includes offset values that range from 0 to 9. The offset values in this example thus may be greater than 3 bits to accommodate offset values greater than 7.

The offset values stored in the LUT 200 in the example of FIG. 2 are determined apriori based on pre-production testing of the IC 100. The example LUT 200 evidences that at least one row of the LUT's rows has a non-linear relationship between the offset values and temperature. For example, for the offset value 108*b* of 1, the offset values in the table are 0, 1, 1, and 2 for temperatures 60° C., 95° C., 125° C., and 150° C., respectively, which is a non-linear relationship. The offset values change from 0 to 1 if the temperature increases from 60° C. to 95° C., but the offset value of 1 remains at 1 even if the temperature increases another 30° C. from 95° C. to 125° C. The non-linear relationship between offset value (and thus trim code) and temperature results from the particular implementation of the oscillator core 102 and how the oscillator core is trimmed.

In another example, an arithmetic logic unit (ALU) can be included to modify the trim code instead of using a LUT. For an ALU implementation, trim codes at 25° C. and at 125° C. are provided as inputs along with temperature information. The ALU implements a polynomial function with coefficients in memory to compute a new trim code for the current temperature. The coefficients are pre-loaded in memory and could be pre-computed from the known behavior of the oscillator.

FIG. 3 is a circuit schematic illustrating an embodiment of a trimmable ring oscillator 303 which can be implemented as the oscillator core 102 of FIG. 1. The trimmable ring oscillator core 302 of FIG. 3 includes three inverters INV1, INV2, and INV3 connected serially in a ring configuration as shown. The output clock can be taken from the output of any of the inverters. Any odd number of inverters can be included to form the ring oscillator. Each inverter INV1-INV3 may include a PFET coupled in series with an NFET (as illustrated by inset 310 for inverter INV1). INV1 inverter is coupled to a supply voltage terminal VDDOSC via a PFET M1, and to a ground terminal via an NFET M4. Similarly, INV2 inverter is coupled to the supply voltage terminal VDDOSC via a PFET M2, and to the ground terminal via an NFET M5. INV3 inverter is coupled to the supply voltage terminal VDDOSC via a PFET M3, and to the ground terminal via an NFET M6.

The upper PFETs M1-M3 receive a bias voltage PBIAS on their gates, and the lower NFETs M4-M6 receive a bias voltage NBIAS on their gates. By varying the bias voltages PBIAS and NBIAS, the gate-to-source voltages of the PFETs M1-M3 and the NFETs M4-M6 are controlled to produce an adjustable current through each inverter. By varying the magnitude of the current through each inverter, the switching speed of each inverter's PFET and NFET can be adjusted thereby controlling the frequency of the ring oscillator's output clock.

The circuit on the left-hand side of FIG. 3 including transistors M7-M18, resistor R1, and capacitor C1 produces the NBIAS and PBIAS voltages for the gates of M4-M6 and M1-M3, respectively. Transistors M7, M9, M13, M17, and M18 are PFETs and M8, M10-12, and M14-M16 are NFETs. R1 is coupled between M8 and the ground terminal. R1 is a trimmable resistance based on the adaptive trim code generated by the digital control circuit 106. In one example, R1 is a parallel combination of individual resistors and switches, with each switch controlled by a bit of the adaptive trim code to select or de-select the corresponding resistor. The current through the series combination of M7, M8, and R1 is labeled I1, and I1 can be increased by decreasing the resistance of R1, or decreased by increasing the resistance of R1. Thus, the adaptive trim code controls the magnitude of I1.

The PFETs M7, M9, M13, and M17 are coupled to form a current mirror. The current through the series combination of M9-M12 is I2. The current through the series combination of M13-M16 is I3, and the current through M17, M18 and C1 is I4. I2 is controlled by I1 via the current mirror formed by M7 and M9. Similarly, I3 is controlled by I1 via the current mirror formed by M7 and M13.

The gates of M12 and M16 are coupled together and are coupled to the drain and the gate of M11. The voltage on the gates of M12 and M16 is NBIAS, which is coupled to the gates of M4-M6. The gate and drain of M15 are coupled together and to the drain of M16. The voltage on the gate/drain of M15 is PBIAS, which is coupled to the gates of M1-M3.

If the adaptive trim code changes to cause the resistance of R1 to decrease, I1 will increase, and, due to the current mirrors, I2 and I3 also will increase. An increase in I2 causes an increase in NBIAS, which is the gate-to-source voltage of M12. With the voltage on the gate of M16 increasing, the voltage on the drain of M16 (PBIAS) will decrease. An increase of NBIAS and a decrease in PBIAS results in an increase in charge current through each inverter's PFET and an increase in discharge current through each inverter's NFET thereby increasing the switching speed of the inverters. The frequency of CLK1 thus increases.

By contrast, if the adaptive trim code changes to cause the resistance of R1 to increase, I1 will decrease, and, due to the current mirrors, I2 and I3 also will decrease. A decrease in I2 causes NBIAS to decrease as well. With the voltage on the gate of M16 decreasing, the voltage on the drain of M16 (PBIAS) will increase. A decrease of NBIAS and an increase in PBIAS results in a decrease in charge current through each inverter's PFET and a decrease in discharge current through each inverter's NFET thereby decreasing the switching speed of the inverters and resulting in a decrease to the frequency of CLK1.

Current I4 charges capacitor C1. The voltage across C1 is VDDOSC, which is an intermediate supply rail for the ring inverter. VDDOSC is controlled to be a relatively fixed supply voltage for the inverters.

FIG. 4 shows another example of an oscillator circuit 400. The oscillator circuit 400 includes current sources 141 and IPTAT, a capacitor CCTAT, a comparator 410, a one-shot 412, a reference voltage VREF, and a transistor switch M41. In this example, M41 is an N-type metal oxide semiconductor field effect transistor (NFET). Oscillator circuit 400 may be fabricated on an IC.

Without temperature compensation, in general an oscillator's output clock frequency generally decreases with temperature. The oscillator circuit 400 of FIG. 4, however, includes a current source whose current is proportional to absolute temperature (PTAT). The PTAT current source charges a capacitor at a rate that is based (at least to some degree) on temperature to reduce the dependence of the clock frequency on temperature, as explained below.

Current source IPTAT is a current source whose current increases with increasing temperature. Current sources 141 and IPTAT are coupled in parallel between a supply voltage terminal 401 and the positive input of comparator 410. In one embodiment, the magnitude of the current from current source 141 is larger than the magnitude of current from IPTAT. The magnitude of the current from current source 141 is generally constant with respect to temperature. The capacitor CCTAT (a capacitor having a capacitance that is complementary to absolute temperature) is coupled between the current sources 141 and IPTAT and ground. With M41 off, the collective current from 141 and IPTAT flows to capacitor CCTAT to thereby charge capacitor CCTAT. The voltage across capacitor CCTAT is designated as "RAMP." The negative input of the comparator 410 is coupled to the voltage reference VREF. Comparator 410 compares the voltage across the capacitor CCTAT to VREF. If the voltage of capacitor CCTAT (RAMP) is larger than VREF, then the comparator 410 asserts its output to a logic high state. If the RAMP is smaller than VREF, then the comparator 410 forces its output to a logic low state. The output signal from the comparator 410 is the oscillator's output clock signal (CLK3). Accordingly, CLK3 is logic high when RAMP is larger than VREF, and CLK3 is logic low when RAMP is smaller than VREF.

The output of comparator 410 is coupled to an input of one-shot 412. The output of one-shot 412 is used to drive the gate of the transistor switch M41. The one-shot 412 produces a pulse of a fixed width on its output to the gate of transistor switch M41 in response to a rising edge on the input of the one-shot. When the output pulse of the one-shot 412 is high, transistor switch M41 closes and capacitor CCTAT discharges through the transistor switch M1 to ground. The one-shot 412 is configured to implement a pulse width of its output pulse large enough to fully discharge the transistor switch M41.

As current from 141 and IPTAT flows into capacitor CCTAT, the voltage on capacitor CCTAT (RAMP) increases. Eventually, the voltage on capacitor CCTAT reaches VREF at which time the comparator asserts CLK3 to a logic high state. After the propagation delay through the one-shot 412, the signal to the gate of the transistor switch M41 becomes logic high thereby turning M41 on for the one-shot pulse width period of time. During that time (M1 is on), capacitor CCTAT discharges its charge through M41 to ground and the voltage on the capacitor CCTAT rapidly falls. As RAMP falls below VREF, the comparator 410 responds by forcing CLK3 to a logic low state. Also, at the end of the pulse from the one-shot 412, the gate of M41 is pulled low thereby turning M41 off. With M41 off, the current from current sources 141 and IPTAT again flows to the capacitor CCTAT eventually causing the RAMP to exceed VREF thereby causing the comparator 410 to again force CLK3 high. The process repeats thereby resulting in a periodic clock signal CLK3.

Figure 5A:
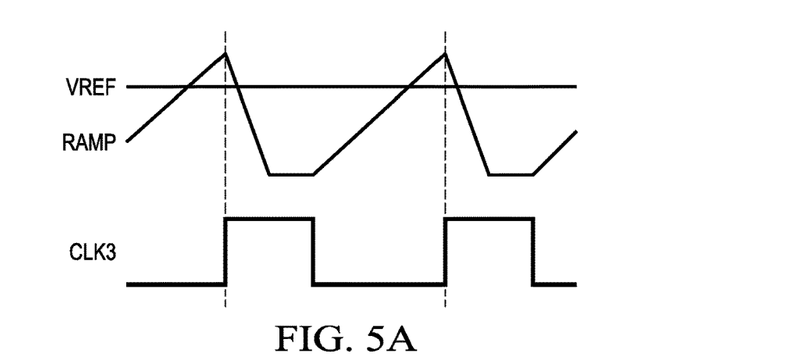
FIG. 5A is an example timing diagram corresponding to the ramp circuit of FIG. 4 in which the frequency of the clock is related to the slope of a ramp signal.
Figure 5B:
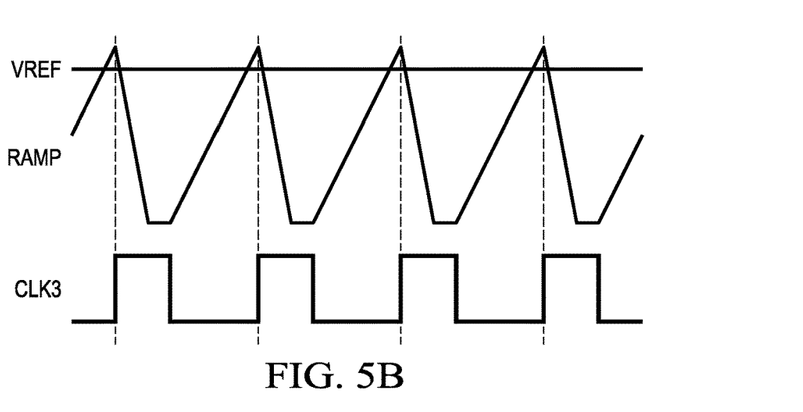
FIG. 5B is a timing diagram illustrating an increase in the clock frequency as a result of an increase of the slope of the ramp signal.

FIG. 5A shows a timing diagram including VREF, RAMP, and CLK3. CLK3 is logic high when RAMP is larger than VREF, and low otherwise. CLK3 transitions high just after RAMP crosses VREF due to the delay through the comparator. The frequency of CLK3 is a function of, at least in part, the positive slope of RAMP (the linearly increasing voltage on capacitor CCTAT). FIG. 5B shows an example timing diagram in which the positive slope of RAMP is larger than in the example of FIG. 5A. In FIG. 5B, the frequency of CLK3 is higher than for CLK3 in FIG. 5A. Thus, to increase the frequency of oscillator 400, the slope of RAMP should be increased, and to decrease the frequency, the slope of RAMP should be decreased.

For a capacitor being charged by a current, the rate of change of voltage across the capacitor is the ratio of the current to the capacitance of the capacitor. Thus, the rate of change of voltage for capacitor CCTAT is the ratio of the sum of IPTAT and 141 to the capacitance of CCTAT. For example, $$\frac{dv(CCTAT)}{dt} = \frac{IPTAT + I41}{CCTAT}$$

As temperature increases, the magnitude of the current from IPTAT also increases. The increasing charge current to capacitor CCTAT causes RAMP to increase at a faster rate thereby causing an increase in the frequency of CLK. By contrast, a decrease in temperature causes IPTAT to decrease thereby causing RAMP to have a smaller slope and the frequency of CLK to decrease.

The capacitor CCTAT has a capacitance that decreases as temperature increases, and increases as temperature decreases. As temperature increases, IPTAT increases and CCTAT decreases, both effects cause the rate of change of CCTAT's voltage to increase. In one embodiment, the capacitor is a CTAT capacitor as shown in the example of FIG. 4. In another embodiment, the capacitor has a capacitance that does not vary with temperature. However, by including a CTAT capacitor, the amount of current produced by IPTAT can be smaller thereby resulting in a lower quiescent current by the oscillator circuit 400.

In one embodiment, capacitor CCTAT is constructed as a metal-oxide-semiconductor (MOS) capacitor operated in the depletion region. When in depletion, various parameters such as intrinsic carrier concentration, the Fermi level, the intrinsic Debye length, etc. have temperature dependencies. The average capacitance of CCTAT during the time in which RAMP increases exhibits a CTAT dependence.

Figure 6:
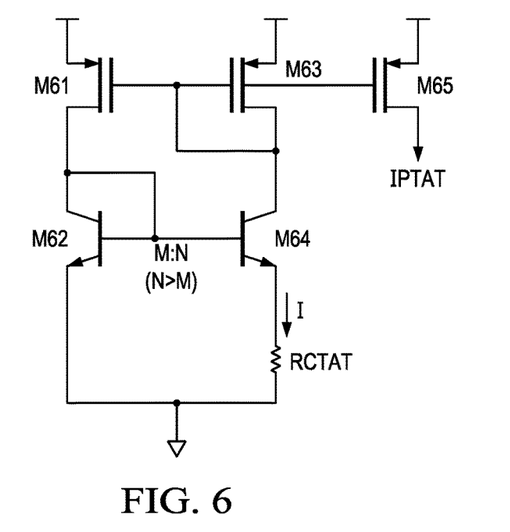
FIG. 6 is an example of a proportional to absolute temperature current source circuit.

FIG. 6 is a circuit showing an example of an IPTAT current source. In this example, the IPTAT current source includes transistors M61-M63. PFET devices M61 and M63 form a current mirror. M62 and M64 are NPN BJTs. From applying Kirchoff's Current Law (KCL) around M62, M64, and RCTAT (although the resistor does not have to have CTAT temperature-dependence), (VBE_M62−VBE_M64−I*RCTAT)=0 (where VBE_62 is the base-to-emitter voltage of M62, and VBE_64 is the base-to-emitter voltage of M64). The difference between the two VBEs can be written as a PTAT voltage VT*In(N/M), where VT is k*T/q. Accordingly, the current I through M64 is a PTAT current.

M62 and M62 impose a delta-Vgs (difference in the Vgs between M62 and M64) across Rctat, which results in an IPTAT current through Rctat. The magnitude of the IPTAT current is delta-Vgs/Rctat. The IPTAT current is mirrored out through M65.

FIG. 4 is an example of a single ramp oscillator. FIG. 7 is an example of a dual ramp oscillator 700. The dual ramp oscillator 700 of FIG. 7 includes two instances of the circuit shown in FIG. 4 as well as a set-reset (SR) flip-flop 730. A first ramp circuit includes current sources IPTAT1 and I71, an NFET M71, a capacitance CCTAT1, voltage reference VREF, and a comparator 710. A second ramp circuit includes current sources IPTAT2 and I72, an NFET M72, a capacitance CCTAT2, voltage reference VREF, and a comparator 720. The output from comparator 710 is coupled to the set (S) input of SR flip-flop 730, and the output from comparator 720 is coupled to the reset (R) input of SR flip-flop 730. The Q output of the SR flip-flop drives the gate of transistor M71, and the Qbar (opposite polarity of Q) of the flip-flop drives the gate of M72. R latches Q low and Qbar high regardless of S (to avoid a stable no switching conditioning). S latches Q high and Qbar low if R is low.

The voltage on capacitor CCTAT1 is RAMP1, and the voltage on capacitor CCTAT2 is RAMP2. When RAMP1 exceeds VREF, the S input of flip-flop 730 is asserted high thereby causing Q (CLK) to be asserted high. With Q being high, M71 is turned on to discharge CCTAT1. Also with Q being high, Qbar is low and M72 is off thereby causing capacitor CCTAT 2 to be charged and RAMP2 increases. Then, when RAMP2 exceeds VREF, the output of comparator 720 is logic high which causes the R input of flip-flop to be asserted. In response to a logic high on the R input, the Q output (CLK) is forced low (which then turns off M71 and permits capacitor CCTAT1 to be charged) and the Qbar output is forced high (which turns on M72 and capacitor CCTAT2 discharges). This periodic pattern repeats and defines the oscillation frequency.

Each ramp circuit in the dual-ramp circuit example of FIG. 7 includes a current source whose current is proportional to absolute temperature. Each ramp circuit also includes a capacitor whose capacitance is complementary to absolute temperature. As for the example of FIG. 4, in other embodiments the CCTAT capacitors can be replaced with capacitors whose capacitance is not complementary to absolute temperature.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal,", "node," "interconnection," "pin," and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors is described herein, other transistors (or equivalent devices) may be used instead. For example, a p-type metal-oxide-silicon field effect transistor ("MOSFET") may be used in place of an n-type MOSFET with little or no changes to the circuit. Furthermore, other types of transistors may be used (such as bipolar junction transistors (BJTs)).

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of the stated value.

Modifications are possible in the described embodiments, and other embodiments are possible, within the scope of the claims.

What is claimed is:
1. An integrated circuit (IC), comprising:
   a temperature sensing circuit having one or more temperature sensing circuit outputs, wherein the temperature sensing circuit is configured to provide temperature signals on the one or more temperature sensing circuit outputs, the temperature signals indicative of a temperature of the IC;

a non-volatile storage configured to store a trim code and an offset value, the trim code corresponding to a first temperature, and the offset value corresponding to a second temperature, the non-volatile storage having a storage output;

an oscillator having a control input and an oscillator output; and a digital control circuit having a temperature sensing circuit input, a clock input, and an adaptive trim code output, wherein the temperature sensing circuit input is coupled to the temperature sensing circuit outputs, the clock input is coupled to the oscillator output, the adaptive trim code output is coupled to the control input, and the digital control circuit is configured to cause the trim code from the non-volatile storage to be provided to the control input, the digital control circuit is configured to modify the trim code responsive to the temperature signals from the temperature sensing circuit and the offset value to produce an adjusted trim code, and to provide the adjusted trim code to the control input.

2. The IC of claim 1, wherein the trim code is an m-bit value, and the offset value is an n-bit value, wherein m is larger than n.

3. The IC of claim 1, wherein the digital control circuit is configured to implement a look-up table (LUT) having multiple rows, each row corresponding to a respective different offset value.

4. The IC of claim 3, wherein each respective row of the multiple rows stores:
a first offset value corresponding to a third temperature; and
a second offset value corresponding to a fourth temperature, wherein at least one of the third or fourth temperatures is between the first and second temperatures.

5. The IC of claim 4, wherein each respective row of the multiple rows further stores a third offset value corresponding to the second temperature, and the third offset value is equal to the offset value from the non-volatile storage.

6. The IC of claim 5, wherein at least one row of the multiple rows has a non-linear relationship among the first, second and third offset values with respect to temperature.

7. The IC of claim 1, wherein the oscillator is a ring oscillator.

8. An integrated circuit (IC), comprising:
a temperature sensing circuit having one or more temperature sensing circuit outputs, the temperature sensing circuit configured to provide temperature signals on the one or more temperature sensing circuit outputs, the temperature signals indicative of a temperature of the IC;
an oscillator circuit having a control input and an oscillator output; and
a digital control circuit having a temperature sensing circuit input, a clock input, and an adaptive trim code output, wherein the temperature sensing circuit input is coupled to the temperature sensing circuit outputs, the clock input is coupled to the oscillator output, and the adaptive trim code output is coupled to the control input, the digital control circuit is configured to modify a trim code responsive to the temperature signals from the temperature sensing circuit and an offset value to produce an adjusted trim code, and configured to provide the adjusted trim code to the control input.

9. The IC of claim 8, further comprising a non-volatile storage having a storage output, wherein the non-volatile storage is configured to store a first trim code and the offset value, the first trim code corresponding to a first temperature, and the offset value corresponding to a second temperature.

10. The IC of claim 9, wherein the digital control circuit is configured to cause the first trim code to be provided to the control input responsive to a power-on or reset event of the IC.

11. The IC of claim 8, wherein the trim code is an m-bit value, and the offset value is an n-bit value, wherein m is larger than n.

12. The IC of claim 9, wherein the digital control circuit is configured to implement a look-up table (LUT) having multiple rows, each row corresponding to a respective different offset value.

13. The IC of claim 12, wherein each respective row of the multiple rows stores:
a first offset value corresponding to a third temperature; and
a second offset value corresponding to a fourth temperature, wherein at least one of the third or fourth temperatures is between the first and second temperatures.

14. The IC of claim 13, wherein each respective row of the multiple rows further stores a third offset value corresponding to the second temperature, wherein the third offset value is equal to the offset value from the non-volatile storage.

15. The IC of claim 14, wherein at least one row of the multiple rows has a non-linear relationship among the first, second, and third offset values with respect to temperature.

16. An oscillator circuit, comprising:
a first comparator having first and second comparator inputs and a first comparator output, wherein the first comparator input is coupled to a reference voltage terminal;
a switch coupled between the second comparator input and a ground terminal and having a control terminal;
a one-shot circuit coupled between the first comparator output and the control terminal;
a first capacitor coupled between the second comparator input and the ground terminal; and
a first current source coupled between a supply voltage terminal and the first capacitor, wherein the first current source is configured to provide a current to the first capacitor that is proportional to absolute temperature;
a second comparator having third and fourth comparator inputs and a second comparator output, wherein the third comparator input is coupled to the reference voltage terminal;
a second capacitor coupled between the fourth comparator input and the ground terminal;
a second current source coupled between the supply voltage terminal and the second capacitor, wherein the second current source is configured to provide a current to the second capacitor that is proportional to absolute temperature; and
a flip-flop having first and second flip-flop inputs, wherein the first flip-flop input is coupled to the first comparator output, and the second flip-flop input is coupled to the second comparator output.

17. The oscillator circuit of claim 16, wherein the first capacitor has a capacitance that is complementary to absolute temperature.

18. The oscillator circuit of claim 16, further including a third current source coupled in parallel with the first current source.

19. The oscillator circuit of claim 16, wherein the second capacitor has a capacitance that is complementary to absolute temperature.

\* \* \* \* \*